United States Patent
Eissa et al.

(10) Patent No.: US 6,551,943 B1
(45) Date of Patent: Apr. 22, 2003

(54) WET CLEAN OF ORGANIC SILICATE GLASS FILMS

(75) Inventors: Mona M. Eissa, Plano, TX (US); Troy A. Yocum, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/652,728

(22) Filed: Aug. 31, 2000

Related U.S. Application Data

(60) Provisional application No. 60/152,164, filed on Sep. 2, 1999.

(51) Int. Cl.⁷ .................... H01L 21/302; H01L 21/461
(52) U.S. Cl. .................. 438/718; 438/745; 438/746; 134/1.1; 134/1.2; 134/1.3
(58) Field of Search .................. 134/1, 1.1, 1.2, 134/1.3; 438/745, 746, 725, 718; 216/79

(56) References Cited

U.S. PATENT DOCUMENTS

| | | | | |
|---|---|---|---|---|
| 5,814,186 A | * | 9/1998 | Nguyen | 156/643.1 |
| 5,886,410 A | * | 3/1999 | Chiang et al. | 257/759 |
| 6,093,635 A | * | 7/2000 | Tran et al. | 438/623 |
| 6,117,785 A | * | 9/2000 | Lee et al. | 438/700 |
| 6,168,726 B1 | * | 1/2001 | Li et al. | 438/718 |
| 6,242,165 B1 | * | 6/2001 | Vaartstra | 430/329 |

* cited by examiner

Primary Examiner—Benjamin L. Utech
Assistant Examiner—Duy-Vu Deo
(74) Attorney, Agent, or Firm—Jacqueline J. Garner; W. James Brady, III; Frederick J. Telecky, Jr.

(57) ABSTRACT

A post-etch clean up process for OSG. After the trench (112)/via (114) etch in a dual damascene process, a wet chemistry comprising HF and $H_2O_2$ is used to remove residues without etching or damaging the OSG film in the ILD (108) or IMD (110).

2 Claims, 2 Drawing Sheets

WET CLEAN OF ORGANIC SILICATE GLASS FILMS

This application claims priority under 35 USC §119(e)(1) of provisional application No. 60/152,164 filed Sep. 2, 1999.

FIELD OF THE INVENTION

The invention is generally related to the field of forming interconnect layers in semiconductor devices and more specifically to interconnect layers having organic silicate glass dielectric films.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a damascene process, the IMD 16 is formed first. The IMD 16 is then patterned and etched to form a trench for the interconnect line. If connection vias have not already been formed, a dual damascene process may be used. In a dual damascene process, after the trench is formed in the IMD, a via is etched in the ILD 12 for connection to lower interconnect levels. The barrier layer 14 and a copper seed layer are then deposited over the structure. The barrier layer 14 is typically tantalum nitride or some other binary transition metal nitride. The copper layer is the formed using the seed layer over the entire structure. The copper is then chemically-mechanically polished (CMP'd) to remove the copper from over the IMD 16, leaving copper interconnect lines 18 and vias 20 as shown in FIG. 1. A metal etch is thereby avoided.

Further improvements in interconnect performance are desired. Accordingly, efforts are being made to include low-k dielectric materials in a copper interconnect structure. One such low-k dielectric is called organic silicate glass (OSG). OSG is defined as a carbon based polymer doped with silicon. As these materials are new to semiconductor processing, sub-processes for incorporating these materials in a process flow are needed. For example, after the trench and via etches described above, a clean up process is required to remove etch residues. The polymer nature of OSG can easily be degraded by chemical treatment.

SUMMARY OF THE INVENTION

The invention is a post-etch clean up process for OSG. After an etch, a wet chemistry comprising HF and $H_2O_2$ is used to remove residues without etching or damaging the OSG film.

An advantage of the invention is providing a clean process that is compatible with OSG and the copper surface.

This and other advantages will be apparent to those of ordinary skill in the art having reference to the specification in conjunction with the drawings.

DETAILED DESCRIPTION OF THE EMBODIMENTS

The invention will now be described in conjunction with a dual damascene process for forming a copper interconnect using an OSG dielectric. it will be apparent to those of ordinary skill in the art that the benefits of the invention may be applied in general to post-etch clean processes involving OSG.

Figure 1:
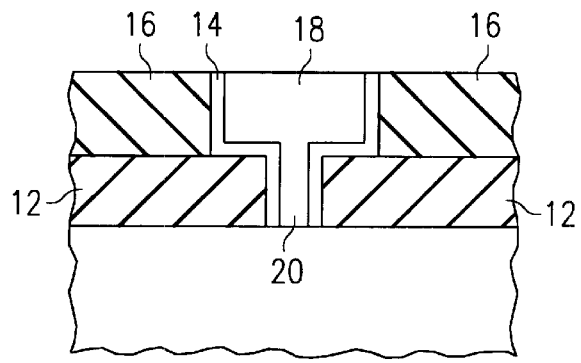
FIG. 1 is a cross-sectional diagram of a prior art interconnect formed using a dual damascene process.
Figure 2A:
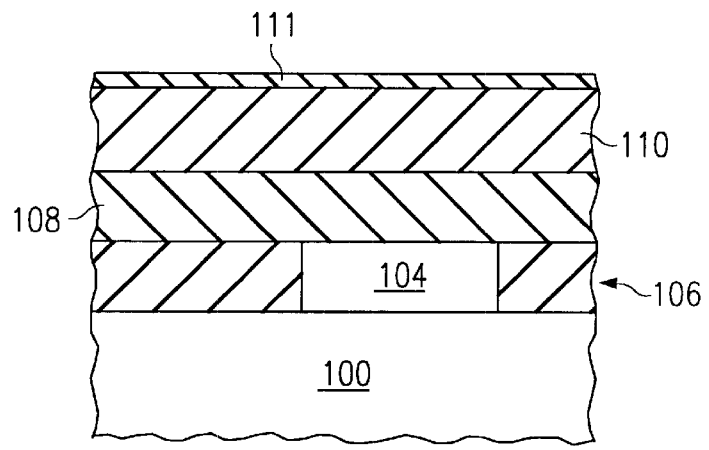
FIGS. 2A–2E are cross-sectional diagrams of a interconnect formed according to an embodiment of the invention.

Referring to FIG. 2A, an intrametal dielectric (IMD) 110 and interlevel dielectric (ILD) 108 are formed over a semiconductor body 100. Semiconductor body 100 is a semiconductor substrate that has been processed through the formation of transistors and/or other devices (not shown) and at least one metal interconnect level 106. Metal interconnect level 106 comprises metal interconnect lines 104 that may, for example, comprise copper.

At least one of IMD 110 and ILD 108 comprises OSG (organic silicate glass). OSG is defined as a carbon based polymer doped with silicon. OSG materials are now commercially available. Black Diamond™ from Applied Materials is one such material. In the preferred embodiment, both IMD 110 and ILD 108 comprise OSG. In addition, IMD 110 may comprise a capping dielectric 111, such a TEOS (tetraethyoxysilane).

Figure 2B:
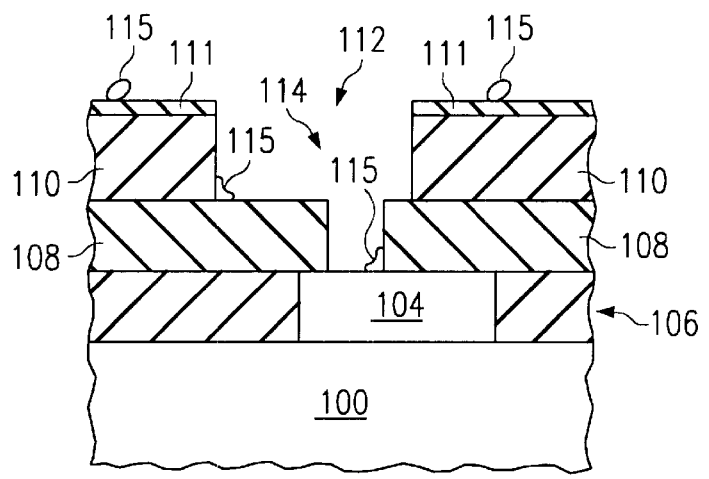
Figure 2C:
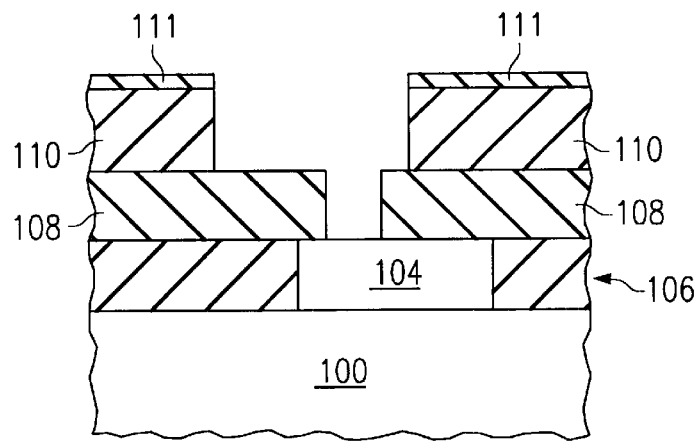

A trench 112 is etched in IMD 110 and a via 114 is etched in ILD 108, as shown in FIG. 2B. As a result of the etch, residue 115 is left on the surface of the device. Thus, a clean process is needed to remove residue 115. A wet solution comprising HF, $H_2O_2$, and deionized water (DIW) is used to remove residue 115, as shown in FIG. 2C. In the preferred embodiment, a HF:$H_2O_2$:DIW ratio of 1:6:445 to 1:3:445 is used for a duration of 150 seconds. The maximum concentration should be 1:3:100. Higher concentrations do not improve results. A duration in the range of 30–60 seconds may be used for the maximum concentration. A ratio of at least 1:3 is believed to be needed for cleaning to occur. Thus, the ratio of HF:$H_2O_2$ in the range 1:6 to 1:3 is preferred.

A wet solution comprising HF, $H_2O_2$, and deionized water (DIW) enables isotropic cleaning of an OSG film without affecting the film's integrity. In experiments, no change was found in the OSG film's thickness, IR or FTIR spectra. In addition, good selectivity against the cap oxide and any exposed copper is obtained. In one experiment, less than 100 Å loss of the cap oxide occurred. If the lower interconnect level comprises copper, copper will be exposed after the via etch and, thus, during the clean. The clean process according to the invention is compatible with exposed copper.

Prior approaches for cleaning OSG used a dry process that requires an oxygen plasma. The oxygen plasma, however, changes the chemical structure of the OSG film. The dry process also has poor selectivity between residue and OSG films.

The cleaning solution according to the invention uses diluted chemistries at room temperature. This reduces equipment degradation, reduces chemical consumption, and meets safety requirements. In addition, high throughput, on the order of 100 wafers/hour, can be obtained.

Figure 2D:
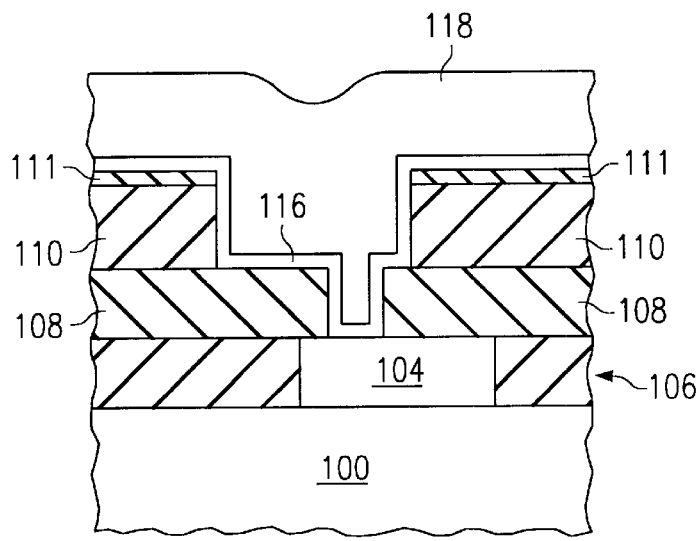

After the post-etch clean, liner 116 and copper 118 are formed, as shown in FIG. 2D. Liner 116 may, for example, comprise TaN. Liner 116 is deposited over IMD 110, including in trench 112 and via 114. Copper 118 is then formed. Typically, a copper seed layer is deposited and an electroplating process is used to over fill the trench 112.

Figure 2E:
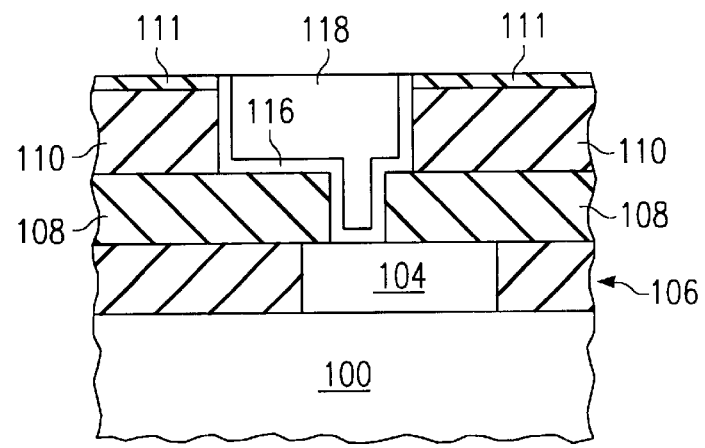

Cu CMP is performed next to planarize the structure and remove unwanted copper 118 and liner 116 from over IMD 110. The result is shown in FIG. 2E. An appropriate slurry, such as an aluminum-based slurry, is used. After polishing, the wafers are put in a polish tank. Typically, the polish tank is filled with deionized water (DIW). A corrosion inhibitor may be added to the polish tank if desired. A terizale, such as BTA (beuzatriazale), may be used to prevent corrosion of copper 118.

As a result of the Cu CMP process, residue, slurry particles, metal contaminants and Cu by-products remain on the surface of copper 118 and IMD 112. Therefore, a clean-up process is performed. For example, a multi-step wet chemistry may be used in a dark environment. The first step uses a basic solution and a surfactant to remove slurry particles. The basic solution may comprise $NH_4OH$ or TMAH (tetramethyl ammonium hydroxide—$(CH_3)_4NOH$) at ~0.07% wt. The second step uses a dilute HF solution. For example, a 1:500 to 1:100 dilution may be used. The purpose of the second step is to remove metal contamination. The last step uses an organic acid to remove copper by-products. Any copper remaining on the surface is removed along with an Cu-oxide. The organic acid may, for example, comprise Citric acid. The concentration is on the order of 0.5% organic acid.

After clean up, the wafers are allowed to dry. A vapor or IPA (isopropanal alcohol) spray can be applied to dry the wafers in a shorter amount of time. The IPA may be applied during the last rinse. By implementing the IPA, any remaining corrosion inhibitor compound is removed. This may be followed by a copper redaction process. For example, a dry $H_2$ passivation step could be performed to remove any copper oxide layer formed or a wet solution of less than 5% $HNO_3$ for 30–60 sec may be performed.

Processing may then continue to form any subsequent metal interconnect layers. The above process may be used for any copper interconnect layer. It is not limited to the second interconnect layer as described above. Furthermore, although OSG is currently being investigated for use with copper interconnects, the invention is not limited to copper interconnects.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:
    forming an interlevel dielectric layer comprising a first organic silicate glass (OSG) film over a semiconductor body;
    forming an intrametal dielectric layer comprising a second OSG film over said interlevel dielectric layer;
    patterning and etching a trench in said intrametal dielectric layer;
    performing a clean up process including the step of subjecting at least a portion of said intrametal dielectric layer to a solution comprising HF and $H_2O_2$; and
    performing an $H_2$ passivation to remove any copper oxide after the step of performing a clean up process.

2. A method for fabricating an integrated circuit, comprising the steps of:
    forming an interlevel dielectric layer comprising a first organic silicate glass (OSG) film over a semiconductor body;
    forming an intrametal dielectric layer comprising a second OSG film over said interlevel dielectric layer;
    patterning and etching a trench in said intrametal dielectric layer;
    performing a clean up process including the step of subjecting at least a portion of said intrametal dielectric layer to a solution comprising HF and $H_2O_2$; and
    providing a solution of less than 5% $HNO_3$ to remove any copper oxide after said step of performing a clean up process.

* * * * *